United States Patent [19]

Sekine

[11] Patent Number: 5,896,398
[45] Date of Patent: Apr. 20, 1999

[54] FLASH MEMORY TEST SYSTEM

[75] Inventor: Kuniyoshi Sekine, Meiwa-mura, Japan

[73] Assignee: Advantest Corp., Tokyo, Japan

[21] Appl. No.: 08/950,608

[22] Filed: Oct. 15, 1997

[30] Foreign Application Priority Data

Oct. 22, 1996  [JP]  Japan ................... 8-279260

[51] Int. Cl.$^6$ ........................................... G06F 11/00
[52] U.S. Cl. ............................................... 371/21.3
[58] Field of Search ........................ 371/21.1, 21.2, 371/21.3, 21.4; 365/185.33

[56] References Cited

U.S. PATENT DOCUMENTS 5,793,774  8/1998  Usui et al. .................. 371/21.1

*Primary Examiner*—Vincent P. Canney
*Attorney, Agent, or Firm*—Muramatsu & Associates

[57] ABSTRACT

A flash memory test system supplies test data to a flash memory under test to write the test data in the specified address of the memory and compares the data in the specified address with expected data to determined whether the data writing for the address is completed. If the data writing is unsuccessful, the write operation is repeated until the test data is correctly stored in the address or the predetermined maximum number of the write operation is reached. The number of repeated write operation is recorded for each address and displayed relative to the physical image of the flash memory under test. The flash memory test system includes a comparator for comparing the data in the flash memory under test with the expected data, a fail counter for counting the number of write operation, a fail analysis memory for storing fail information and the counted numbers, and a work station for processing the fail information and the counted numbers and displaying the results of the analysis with respect to a physical image of the flash memory under test.

8 Claims, 5 Drawing Sheets

(A)

FLASH MEMORY TEST SYSTEM

BACKGROUND OF THE INVENTION

This invention relates to a flash memory test system which tests and evaluates flash memories, and more particularly, to a flash memory test system which tests write and erase performance of a flash memory, counts the numbers of times of write or erase operations required until the data is successfully written or erased for each address of the flash memory, and processes and analyzes the acquired data and displays the distribution of the numbers of times with respect to the physical locations in the flash memory.

A flash memory is a non-volatile IC memory which belongs to a category of programmable read only memories (PROM) whose data therein is rewritable. A flash memory has a feature in that all of the data bits or a block of data bits in the flash memory can be erased or written at the same time. A flash memory is a large capacity memory whose data is rewritable for a number of times. A flash memory has such functional modes as a data read mode, a data write mode (program mode), a write data verify mode (program verify mode), an erase mode, and other functional modes.

The function in these modes is controlled by writing a specific command corresponding to each of the modes in a controller within the flash memory from the external source by a timing of a write enable (WE) signal. The flash memory does not have an exclusive terminal for writing these commands, and thus, shares a data terminal of the memory to write the commands. The switching between the data and the command is performed by, for example, changing a voltage of a specific voltage supply. In this patent specification, the present invention is explained in detail mainly with respect to the write function, but it can be similarly applied to the erase function of the flash memory as well.

In writing the data in each address, because of the unique physical structure, a flash memory does not necessarily succeed data writing in one write operation. Rather, a plurality of write operation must be repeated several times until the data successfully stored in the designated address. The number of repetition required for the successful data writing (heretofore "writing number") is different from address to address even when the kind of flash memory to be tested (heretofore "MUT") is the same.

In testing the flash memories, for the reasons of achieving longer life times, the data write operation should not be repeated for the addresses that have already experienced the successful data writing. In the data writing test, the MUT is judged as "good quality" when the data writing is successfully completed in the memory cells of all of the addresses within a predetermined number such as 25 times of the write operation.

FIG. 4 is a schematic diagram showing a flash memory test system in the conventional technology. In general, a memory test system supplies test data (write data), control data and address data to a flash memory under test to write the test data in the specified address of the flash memory. The data stored in the flash memory is then read out and compared with expected data, which is usually the same as the write data, and the comparison results are stored in a fail analysis memory with respect to each address of the flash memory for failure analysis.

In FIG. 4, the flash memory test system includes an engineering work station (EWS) 10 and a test processor 11 which are connected to a tester hardware through a tester bus. The tester hardware includes a timing generator 12, a pattern generator 13, a wave formatter 14, a driver 15, an analog comparator 16, a logic comparator 17 and a fail analysis memory 18. A flash memory 5 to be tested (MUT) is connected to the driver 15 and the analog comparator 16.

The work station EWS 10 functions as a user interface controller while the test processor 11 controls the overall operation of the test system. Based on a start command from the EWS 10, the test processor 11 starts the test operation. Sending and receiving of control signals or data signals is performed between each unit through the tester bus. The timing generator 12 generates clock timing signals which determine the overall timings of the test system and sends the clock timing signals to the pattern generator 13.

The pattern generator 13 generates a control signal CS such as WE (write enable) signal, a test pattern data signal TPD and an address signal ADRS to be supplied to the MUT 5, and an expected value pattern to be supplied to the logic comparator 17. The address signal ADRS is also supplied to the fail analysis memory 18. The wave formatter 14 converts the wave shapes of the logic signals from the pattern generator 13 to appropriate wave forms such as RZ (return-to-zero), NRZ (non-return to zero) or EOR (exclusive OR) wave forms. The wave formatter 14 then gives the wave formatted logic signals to the MUT 5 through the driver 15.

In this manner, in the write operation, the test data TPD is written in the address of the MUT 5 defined by the address data ADRS when the control data CS indicates write cycles. In the read operation, the resultant data in the address of the MUT 5 is examined by reading the data therein. In the read operation, the control data CS shows read cycles, and the address data ADRS defines the address of the MUT 5 whose data to be examined.

The resultant data from the MUT S is compared by the analog comparator 16 with reference voltages to determine the logical levels of the read out data. The output of the analog comparator 16 is provided to the logic comparator 17 wherein it is compared with the expected data from the pattern generator 13. The logic comparator 17 determines whether the stored data in the MUT 5 logically coincides with the expected data, and the comparison results are sent to the fail analysis memory 18.

The fail analysis memory 18 gives a write enable inhibit signal /WE to the wave formatter 14 for the address of the MUT 5 whose stored data agrees with the expected data, thereby prohibiting the system from repeating the write operation for the same address any further. The write operation is repeated for the remaining addresses whose data does not agree with the expected data until the stored data agrees with the expected data or until the predetermined maximum numbers of write operation have been performed.

During this repeated write and read process, in case where all of the addresses attain PASS (match) results, the process terminates by sending an MF (match flag) signal from the fail analysis memory 18 to the pattern generator 13. Alternatively, when the writing test is repeated until the predetermined maximum number of times, the process terminates and proceeds to the next test. The fail analysis memory 18 stores the results of the data writing test to be used in the fail analysis stage of the MUT 5.

After the predetermined numbers of the writing test are completed for all of the addresses of the MUT 5, the EWS 10 acquires the content of the fail analysis memory 18 through the test bus and the test processor 11. Based on the information from the failure analysis memory 18 that is read out, the failure information is shown on a display of the work station EWS 10. Although not shown, the failure information is shown, for example, in a bit-map display for each address or each bit. As an example, a failure map that shows a blank for each satisfactory address, and shows character F for each defective address of the MUT 5.

FIG. 5 is a timing chart for explaining the procedure of the writing test for the flash memory by the memory test system of FIG. 4. FIG. 6 is a flow chart showing the procedure of the writing test. With reference to FIGS. 5 and 6 in combination with FIG. 4, the operational procedure of the writing test of the flash memory is further explained below. In this example, it is explained for the case where the MUT 5 has a controller therein to compare the data in the specified address of the MUT 5 with the test data (expected data) and generate a fail signal when both data disagree with each other.

The timing chart of FIG. 5 shows three logic signals to be transmitted from the wave formatter 14 to the MUT 5. The address of the MUT 5 is specified by the address signal ADRS of FIG. 5A from the wave formatter 14. The write enable signal WE of FIG. 5B is provided to the MUT 5 through the control signal CS. When the write enable signal WE is low, the write operation of the MUT 5 is effective. The test data TPD of FIG. 5C is transmitted to the MUT 5 to be written therein.

First, a command signal for the program setup mode is sent through the test pattern data TPD to set the MUT to the program (data write) mode. Then, test data is transmitted to the MUT 5 to write the test data in the address specified by the address ADRS. Then the program verify mode is set to verify the data in the specified address while maintaining the test data during the verify mode. The controller in the flash memory 5 reads the data in the specified address and compares the data with the test data, i.e., the expected data. When they do not match with one another, the write operation for the address is considered to be failure and a program fail signal is output from the MUT 5. This process is repeated for all of the addresses of the MUT 5.

FIG. 6 is a flow chart of the above-explained writing test. As noted above, because of the unique physical structure of a flash memory, one cycle of the write test does not necessarily pass all the addresses. Hence, the similar test procedure is repeated several times after the first cycle of the writing test. Further, in testing a flash memory, it is usually required that the write operation be suspended for the addresses that are already successful in writing the data therein. Hence, by referring to the fail analysis memory 18 that stores test results up to the last test cycles, the write enable inhibit signal /WE is transmitted to the wave formatter 14 for the addresses that have already passed the writing test, so that the write enable signal WE is prohibited from reaching the MUT 5.

In FIG. 6, upon starting the writing test, RETRY is set to "1" in the step S1, and the address ADD is set to "0" in the step S2. Then, in the step S3, it is determined whether the PROGRAM, i.e., the data writing for the first address of the MUT 5 has been completed. If it is not completed, PROGRAM (data writing) starts in the step S4, and in the VERIFY step S5, the data in the designated address is compared with the expected data.

In the step S3, if the answer is "yes", i.e., the data writing is completed, the write enable WE is masked based on the write enable inhibit signal /WE from the fail analysis memory 18 to prohibit the system from writing the data in the same address. Then, in the step S7, it is determined whether the address in question is the maximum address. If it is not, the address number is added by one in the step S8 and the process goes back to the step S3 to repeat the process in the steps S3–S7.

If the address in question is the maximum address in the step S7, then it is determined whether all the addresses of the MUT 5 are successful in the data writing in the step S9. In case where not all of the addresses are successful, it is determined whether the number of RETRY reaches the predetermined maximum number in the step S10. If the answer is "no", RETRY is added by one in the step S11 and the whole process in the foregoing is repeated. If the answer in the step S10 is "yes" or all of the addresses in the MUT are successful in the data writing in the step S7, the work station EWS 10 reads the data in the fail analysis memory 18 in the step S12 and determines whether all the data indicate "PASS" in the step S13. If the answer is "yes", the MUT 5 is judged as a good device, if "no" it is a defective device.

The pass/fail test for a flash memory can be sufficiently achieved by the conventional test system in the foregoing. However, flash memories have a limited life-span since it is basically a read-only memory that are rewritable. The number of times for rewriting data therein is limited, and such numbers of times vary from device to device. Hence, if it is possible to anticipate the number of possible rewrite operation in the write/erase cycles, a value of the flash memory will be increased. The value of the flash memory is further increased if the numbers of possible rewrite operation can be increased.

It is known in the art that one of the factors that affects the number of possible data rewriting in flash memories is the uniformity in the manufacturing process of the flash memories. Moreover, the uniformity in the manufacturing process of the flash memories correlates to the number of times required for the successful data writing in the flash memories. The minimum number of the possible write/erase cycles can be predicted from this uniformity. Further, based on the manufacturing uniformity, it is considered that the life times of the flash memories can be prolonged.

SUMMARY OF THE INVENTION

Therefore, it is an object of the present invention to provide a flash memory test system which is capable of counting the number of write operation required for successfully writing the data in the specified address of the flash memory.

It is another object of the present invention to provide a flash memory test system which is capable of counting the number of write operation required for successfully writing the data in the specified address of the flash memory and displaying the distribution of such numbers relative to a physical image of the flash memory.

It is a further object of the present invention to provide a flash memory test system which is capable of evaluating the uniformity of the manufacturing process of the flash memories and providing means for improving the life time of the flash memories.

The flash memory test system of the present invention measures the number of write operation required to succeed in writing the data in each address of a flash memory under test in a wafer phase or a chip phase, performs data processing to display the distribution conditions of the numbers relative to the physical locations of the address, and feedbacks the test results to the manufacturing process to improve the production quality of the flash memory.

The flash memory test system supplies the test data to the flash memory under test to write the test data in the specified address and compares the data in the specified address with the expected data to determined whether the data writing in the address is completed. In case where the data writing is not successful, the write operation is repeated until the test data is correctly stored in the address or the predetermined maximum number of times of the write operation is reached. The number of times required for the data is recorded for each address and displayed relative to the physical image of the flash memory under test.

The flash memory test system includes a comparator for comparing the data in the specified address of the flash memory under test with the expected data and generates a fail signal when both data disagrees with one another, a fail counter for counting the number (writing number) of times the write operation required for writing or erasing the data in the specified address of the flash memory under test, a fail analysis memory for storing fail information from the comparator and the writing numbers from the fail counter corresponding to each address of the flash memory under test, and a work station for processing the fail information and the writing numbers in the fail analysis memory and displaying the results of the processing with respect to a physical image of the flash memory under test.

Various programs and files to process the fail information and the writing numbers are prepared in the work station. The work station has a computer inside which performs fail analysis for the fail information and the counted number with respect to the addresses of the flash memory under test. The results of the fail analysis is displayed on the work station with a clear image of the physical locations in the flash memory under test accompanied by the writing numbers involved in that locations.

One of the display images is a wafer map wherein the writing numbers are classified into several groups and displayed with respect to the physical locations of the wafer. By setting several distinctions of the writing numbers, the distribution of the writing numbers can be displayed in characters, patterns, or colors for each address, each group of addresses, or each chip on the wafer on the X and Y axes. Three-dimensional bar charts can also be used. In another display image, the dispersion of the writing numbers is listed in a table format. The maximum, minimum and average values of the writing numbers for each chip are listed. In a further example of display image, a physical image of a chip is displayed with each address of the memory cell in the chip in the X and Y axes wherein the writing number for each address of the chip is provided as well as the maximum, minimum and average numbers are also listed.

According to the present invention, the flash memory test system counts the number of the write operation required to succeed in writing the data in each address of the flash memory under test, and processes the acquired data, and displays the writing numbers with the physical image of the wafer or chip of the flash memory in the X and Y coordinates in a manner easily understandable. This distribution of the writing numbers correlates to the uniformity in the production process of the flash memories and to the life times of the write/erase cycles of the flash memories. Thus, the test results by the memory test system of the present invention can anticipate the life times and improve such life times of the flash memories.

DETAILED DESCRIPTION OF THE PREFERRED EMBODIMENTS

Figure 1:
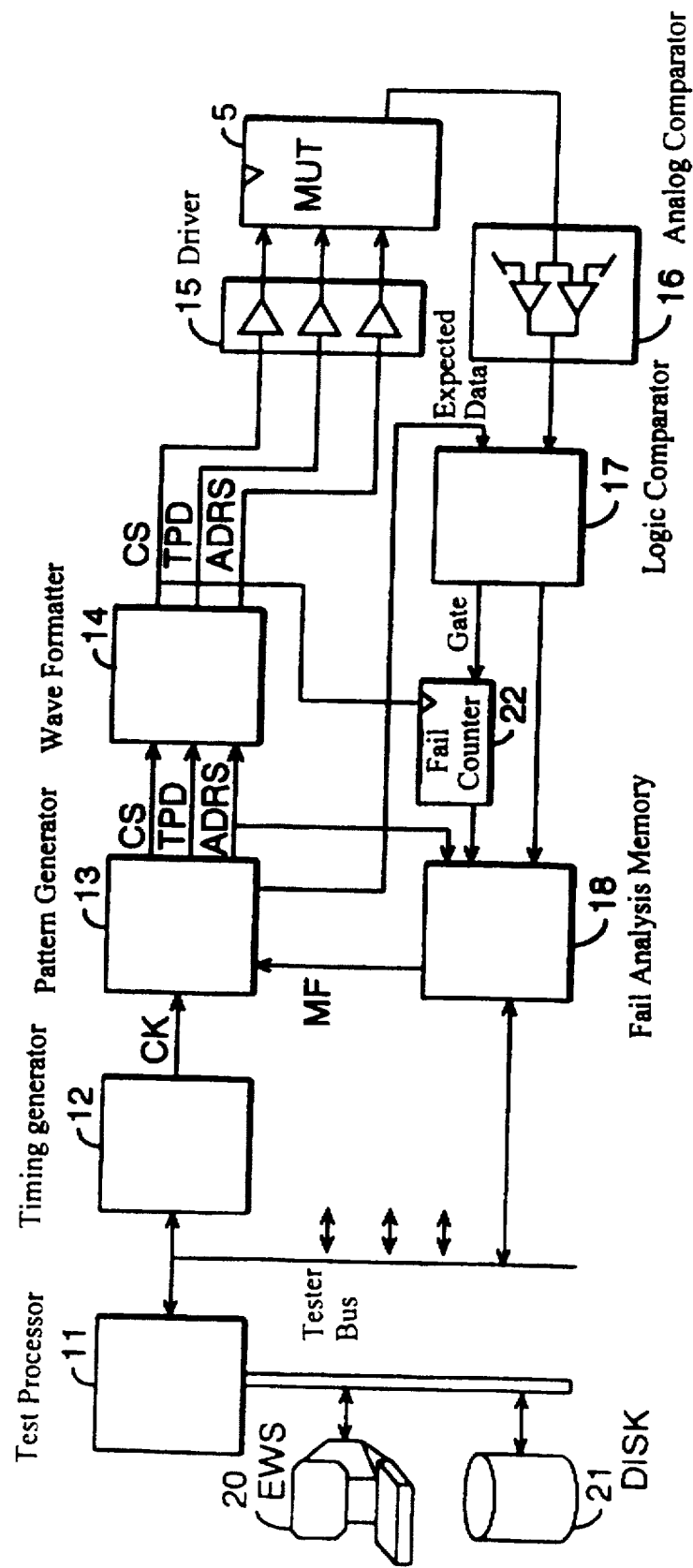
FIG. 1 is a schematic diagram showing a structure of an embodiment of the flash memory test system in accordance with the present invention.

FIG. 1 shows an example of structure in the flash memory test system of the present invention. In FIG. 1, the flash memory test system includes an engineering work station (EWS) 20 with a large capacity storage DISK 21 and a test processor 11 both of which are connected to a tester hardware through a tester bus. The tester hardware includes a timing generator 12, a pattern generator 13, a wave formatter 14, a driver 15, an analog comparator 16, a logic comparator 17, a fail analysis memory 18 and a fail counter 22. A memory 5 to be tested (MUT) is connected to the driver 15 and the analog comparator 16.

The work station EWS 20 functions as a user console while the test processor 11 controls the overall operation of the test system whole apparatus. Based on a start command from the EWS 20, the test processor 11 starts the test operation. Sending and receiving of control signals and data signals is performed between each unit through the tester bus. The timing generator 12 generates clock timing signals which determine the overall timings of the test system and sends the clock timing signals to the pattern generator 13.

The pattern generator 13 generates a control signal CS such as a write enable signal WE, a test data signal TPD, a address signal ADRS to be supplied to the MUT 5, and expected data to be supplied to the logic comparator 17. The address signal ADRS is also supplied to the fail analysis memory 18. The wave formatter 14 converts the wave shapes of the logic signals from the pattern generator 13 to appropriate wave forms such as RZ (return-to-zero), NRZ (non-return to zero) or EOR (exclusive OR) wave forms. The wave formatter 14 then gives the wave formatted logic signals to the MUT 5 through the driver 15.

In this manner, in the write operation, the test data TPD is written in the address of the MUT 5 defined by the address data ADRS when the control data CS indicates write cycles. In the read operation, the resultant data in the address of the MUT 5 is evaluated by reading the data therein. In the read operation, the control data CS shows read cycles, and the address data ADRS defines the address of the MUT whose data to be examined.

The resultant data from the MUT 5 is compared by the analog comparator 16 with reference voltages to determine the logical levels of the read out data. The output of the analog comparator 16 is provided to the logic comparator 17 wherein it is compared with the expected data from the pattern generator 13. The logic comparator 17 determines whether the stored data in the MUT 5 coincides with the expected data, and the comparison results are sent to the fail analysis memory 18. In the example of FIG. 1, the logic comparator 18 also sends a gate signal to the fail counter 22 when the data from the MUT does not agree with the expected data. Thus, the fail counter 22 counts the number (writing number) of write operation required for the address of the MUT 5 until the memory cell in the address successfully stores the test data.

The fail analysis memory 18 gives a write enable inhibit signal /WE to the wave formatter 14 for the address of the MUT 5 whose stored data agrees with the expected data, thereby prohibiting the test system from repeating the writing test for the same address any further. The write operation is repeated for the remaining addresses whose data do not coincide with the expected data until the data agree with the expected data or until the predetermined maximum number of write operation has been performed.

During this repeated write and read process, in case where all of the addresses attain PASS (match) results, the process terminates by sending an MF (match flag) signal from the fail analysis memory 18 to the pattern generator 13. Alternatively, when the writing test is repeated until the predetermined maximum number of times, the process terminates and proceeds to the next test. The fail analysis memory 18 stores the results of the data writing test to be used for fail analysis of the MUT 5. The fail analysis memory 18 also stores the number of required write operation from the fail counter 22 for each address of the MUT 5.

As noted above, the fail counter 22 counts the number (writing number) of the write operation required for each of the addresses of the MUT 5. The counting operation can also be made by the test processor 11 through a software process. However, a high speed counting operation can be achieved by the fail counter 22 as a separate hardware rather than the software procedure. The fail counter 22 counts the number of write operation, for example, by counting the number of pulses in the control signal CS from the wave formatter 14, during the time of a gate signal provided from the logic comparator 17. The gate signal is closed when the data in the address coincides with the expected data. The gate signal can also be closed when the predetermined maximum number of write operation has been repeated.

The gate signal can also be acquired from other sources such as from the pattern generator 13 or the fail analysis memory 18. Although the count pulses are obtained from the wave formatter 14 in FIG. 1, other arrangements are also possible such as counting the output signal of the logic comparator 18 or the number of "PROGRAM" instructions generated by the pattern generator 13. The counted data by the counter 22 is stored in the fail analysis memory 18 along with the corresponding address data of the MUT 5.

After the predetermined number of the writing test is completed for all of the addresses of the MUT 5, the EWS 20 acquires the content of the fail analysis memory 18 though the test bus and the test processor 11. Based on the information from the fail analysis memory 18 that is read out, the failure information as well as the distribution of the writing numbers required for MUT 5 are illustrated on the display of the EWS 20.

Figure 2:
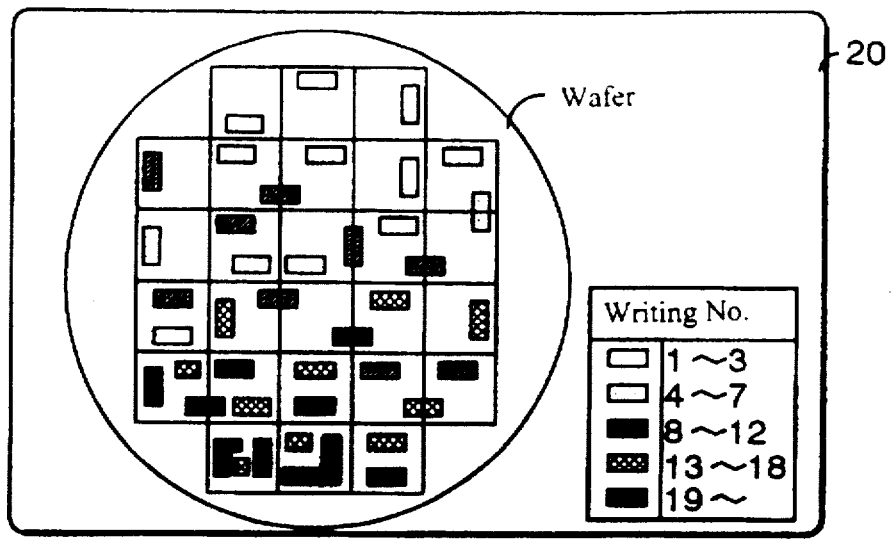
FIG. 2A-2C are examples of displayed image on a display screen of the work station EWS indicating the distribution of the number of times of the write operation required of the flash memory under test according to the present invention.
Figure 3:
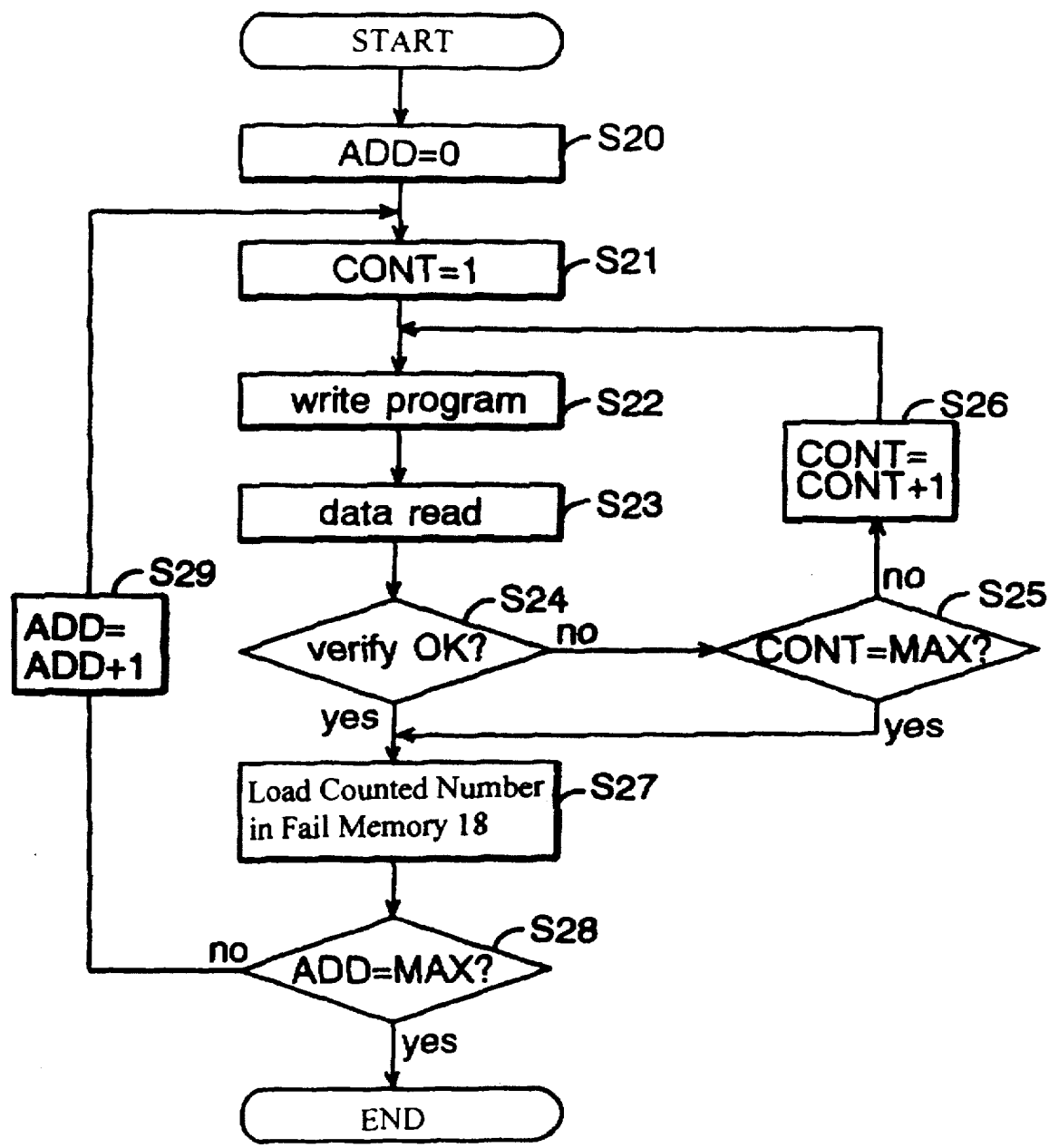
FIG. 3 is a flow chart showing an example of operation in the flash memory test system of the present invention shown in FIG. 1.
Figure 4:
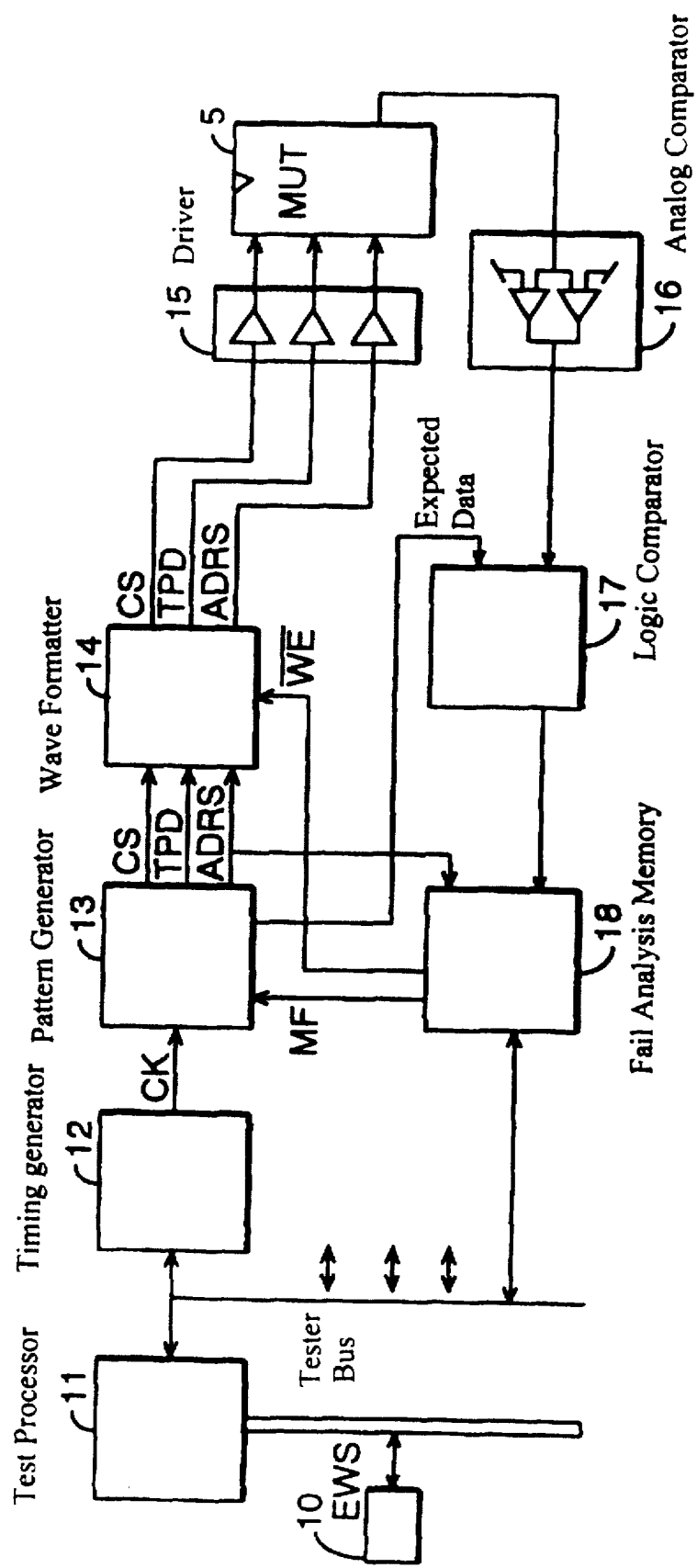
FIG. 4 is a schematic diagram showing a structure of the flash memory test system in the conventional technology.
Figure 5:
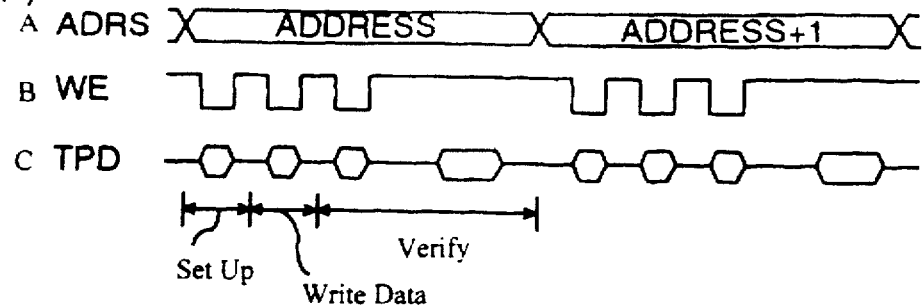
FIG. 5 is a timing chart for explaining the procedure of the write test of the flash memory in the flash memory test system of FIG. 4.
Figure 6:
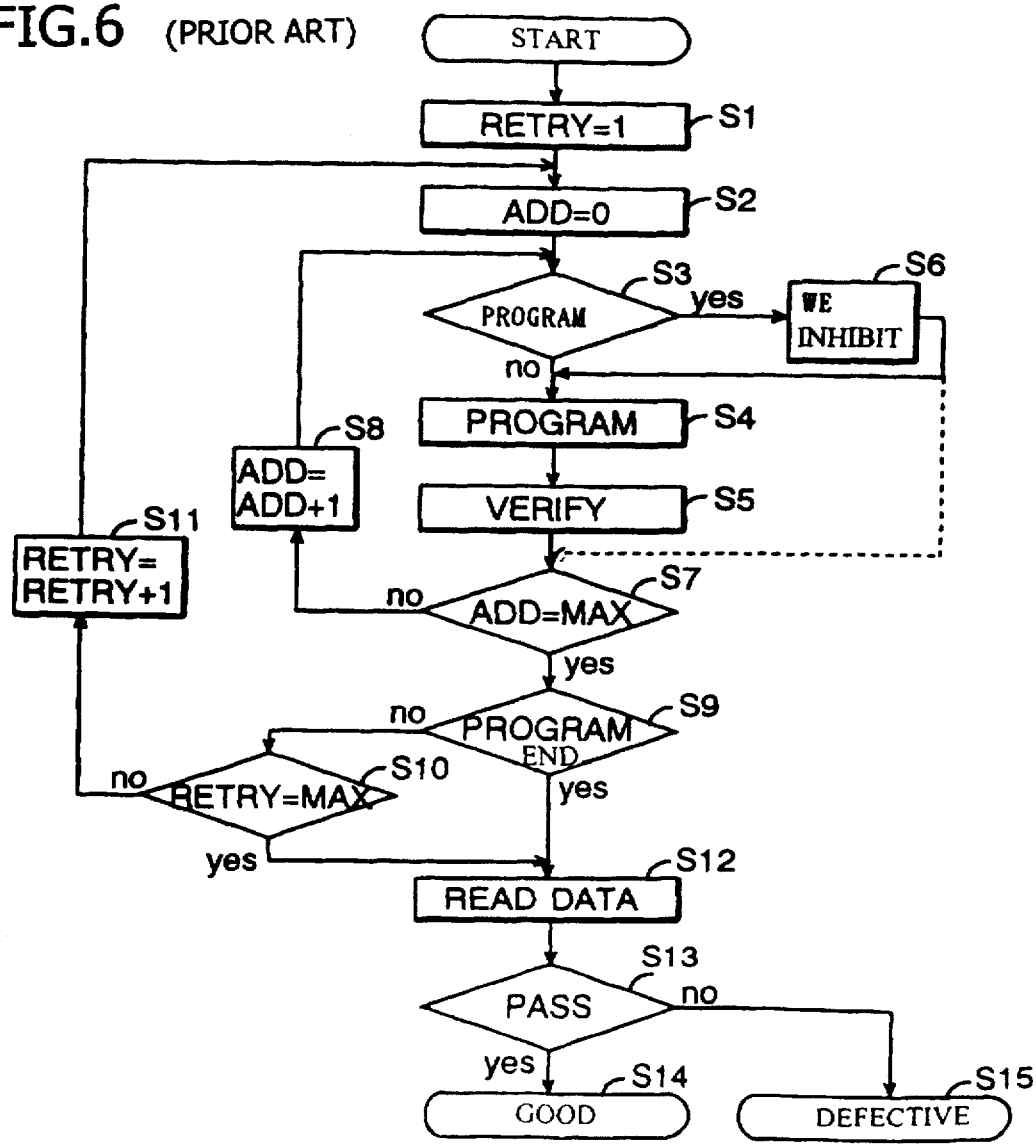
FIG. 6 is a flow chart showing an example of operation in the flash memory test system in the conventional technology of FIG. 4.

Before going into the display examples of FIG. 2, the operational procedure in the foregoing is explained with reference to the flow chart of FIG. 3. Until the data writing is succeeded for each address or the predetermined maximum number of the repetition is reached, the write operation is repeated. The number of write operation is counted by the counter 22 and the result is stored in the fail analysis memory 18. Then, the next address of the MUT 5 is defined and the writing test is continued. This process is performed for all of the addresses.

At the start of the write operation, the address signal is set to "0" in the step S20 and the counter 22 is set to "1" in the step S21. Then, the write operation is started in the step S22 wherein the test data is written in the designated address of the MUT 5. Then, the data stored in the address is read in the step S23 and is compared with the test data (expected data) in the step S24 to determine whether the two data coincide with one another.

If there is no coincidence between the two data, it is determined whether the counted number in the counter 22 is reached the predetermined maximum number in the step S25. In case where the counted number is not the maximum number, counted number is added by "1" and the write and verify operation in the steps S22–S24 is repeated. If the two data match with each other in the step S24, or the counted number is reached the predetermined maximum number in the step S25, the counted number (writing number) is stored in the fail analysis memory 18 in the step S27.

In the step S28, it is determined whether the address of the MUT 5 is the maximum value, and if not, address signal is incremented by "1" in the S29, while the counter 22 is set to "1" again in the step S21. If the present address is the maximum address of the MUT 5 in the step S28, the write operation is completed and the procedure of FIG. 3 ends. Then, the failure analysis process may be begin wherein the test results in the fail analysis memory 18 are processed and displayed with respect to each address of the MUT S on a display screen of the work station EWS 20.

FIGS. 2A–2C are examples of displayed image on the display screen of the work station EWS indicating the distribution of the writing numbers for the corresponding addresses of the flash memory under test according to the present invention. When the test is completed for all or predetermined range of addresses, the resultant data stored in the fail analysis memory 18 is transmitted to the high capacity DISK 21 through the tester bus.

At least one or more data processing programs to perform the display process are stored in the DISK 21. Such programs include a condition set program to create a condition data file, a device test program to create a map management file and a retry data (writing number) file, an image conversion program to convert the retry data file to an image, a retry map output program to display the retry map on the screen, and an information display program to display the information on the map management file and the retry data file. Preferably, additional programs such as a calculation program to obtain the maximum, minimum or average value of the writing numbers for a plurality of addresses are also provided in the DISK 21.

When the data stored in the fail analysis memory 18 is transmitted to the DISK 21, the data processing starts under the control of the EWS 20. First, a condition set data file is created by initiating the condition set program. Then, a map management file and a retry data file are created by initiating the device test program. The image conversion program is initiated to convert the retry data file to an image. The retry map output program is executed to display the retry map showing the writing number on the screen. The information display program starts and displays the information in the map management file and the retry data file on the retry map.

In the example of FIG. 2A, the display image is a wafer map wherein the writing numbers are classified into several groups and displayed with respect to the physical locations of the wafer. By setting several distinctions of the writing numbers, the distribution of the numbers can be displayed in characters, patterns or colors for each address, each group of addresses, or each chip on the wafer on the X and Y axes. Three-dimensional bar charts can also be used.

FIG. 2B shows another example of display image wherein the dispersion of the writing numbers is listed in a table format. The maximum, minimum and average values of the writing numbers for each chip are listed. FIG. 2C shows a further example of display image wherein a physical image of a chip is displayed with each address of the memory cell in the chip on the XY plane. In this example, the writing number is displayed with respect to each address of the chip while the maximum, minimum and average writing numbers are also listed.

As described above, there are several kinds of display images available such as the one directly showing the writing numbers, the one showing the number converted to the patterns or colors, or the one with a two-dimensional bar graph or a three-dimensional bar graph. In sum, it is desirable that such a display image clearly shows the distribution and uniformity of the writing numbers. Based on this distribution in the wafer or chips, the life-time of the data write/erase cycles of a flash memory can be predicted and be displayed on the display screen. Based on the data acquired in the foregoing, the manufacturing process of the flash memories can be improved so that the writing numbers become uniform in the flash memories.

The above embodiment explained for the case wherein the fail counter 22 and the fail analysis memory 18 shown in FIG. 1 are separate components. However, other arrangements are also possible such as having means for directly accumulating the data in the fail analysis memory by the tester processor 11 or the like.

The above embodiment explained the distribution analysis for all of the addresses or the range of addresses of the flash memory to be measured. However, it is also possible to test the distribution of the writing numbers by random sampling the address of the memory under test by a predetermined address sequence so that the fail analysis can be performed in a short period of time. For example, memory cells that are in equal distance with each other are selected for the test to display a distribution condition without accessing all of the memory cells in the flash memory.

In such a case, if an internal physical arrangement of the addresses of the memory under test is different from the outside address pins, or the memory under test has redundant memory cells to be replaced with defective memory cells, an address scrambler known in the art may be used to normalize the physical address in the memory. Examples of such a random address sampling include generating only even number addresses or generating every $2^N$ addresses, or generating one or more addresses in every block of addresses. It is assumed, in these random sampling methods, that statistical dispersion is very small among the memory cells that are adjacent to one another within several micrometers. Under the random sampling method, it is possible to significantly reduce the data volume and thus, a high-speed distribution analysis can be performed.

As has been in the foregoing, according to the present invention, the flash memory test system counts the number of write operation required to succeed in writing the data in each address of the flash memory under test, and processes the acquired data, and displays the numbers with the physical image of the wafer or chip of the flash memory in the X and Y coordinates in a manner easily understandable. This distribution of the writing numbers correlates to the uniformity in the production process of the flash memories and to the life times of the write/erase cycles of the flash memories.

Thus, the test results by the memory test system of the present invention can anticipate the life times and improve such life times of the flash memories.

What is claimed is:

1. A flash memory test system for testing a flash memory which requires one or more write cycles for writing or erasing data in a specified address by supplying test data to the flash memory under test to write the test data in the specified address and comparing the data in the address with expected data to determined whether data writing or erasing for the address is completed, comprising:

a comparator for comparing the data in the specified address of the flash memory under test with the expected data and generates a fail signal when the data disagrees with the other;

a fail counter for counting the number of times of the write cycles required for successfully writing or erasing the data in the specified address of the flash memory under test;

a fail analysis memory for storing fail information from the comparator and the counted numbers from the fail counter corresponding to each address of the flash memory under test; and a work station for processing the fail information and the counted numbers in the fail analysis memory and displaying the results of the processing with respect to a physical image of the flash memory under test.

2. A flash memory test system as defined in claim 1, wherein the results displayed by the work station includes distribution of the counted numbers with respect to physical locations of memory cells in the flash memory under test.

3. A flash memory test system as defined in claim 2, wherein the physical image of the flash memory under test shows an wafer image having a plurality of flash memories or a chip image having a plurality of memory cells, the physical image being provided with the counted numbers relative to locations on the wafer or chip image.

4. A flash memory test system as defined in claim 2, wherein the distribution of the counted numbers is illustrated by the work station by means of characters, patterns or colors in a two-dimensional or three-dimensional image.

5. A flash memory test system for testing a flash memory which requires one or more write cycles for writing or erasing data in a specified address by supplying test data to the flash memory under test to write the test data in the specified address and comparing the data in the address with expected data to determined whether data writing or erasing for the address is completed, comprising:

a timing generator for generating a reference clock signal to be used as a timing reference for overall operation of the flash memory test system;

a pattern generator for generating test data, control data and address data to be supplied to the flash memory under test, the test data being used as expected data;

a comparator for comparing the data in the specified address of the flash memory under test defined by the address data from the pattern generator with the expected data and generates a fail signal when the data disagrees with the other;

a fail counter for counting the number of times of the write operation required for successfully writing or erasing the data in the specified address of the flash memory under test;

a fail analysis memory for storing fail information from the comparator and the counted numbers from the fail counter corresponding to each address of the flash memory under test; and a work station for processing the fail information and the counted numbers in the fail analysis memory and displaying the results of the processing with respect to a physical image of the flash memory under test.

6. A flash memory test system as defined in claim 5, wherein the results displayed by the work station includes distribution of the counted numbers with respect to physical locations of memory cells in the flash memory under test.

7. A flash memory test system as defined in claim 6, wherein the physical image of the flash memory under test shows an wafer image having a plurality of flash memories or a chip image having a plurality of memory cells, the physical image being provided with the counted numbers relative to locations on the wafer or chip image.

8. A flash memory test system as defined in claim 6, wherein the distribution of the counted numbers is illustrated by the work station by means of characters, patterns or colors in a two-dimensional or three-dimensional image.

* * * * *